(12) United States Patent
Sun et al.

(10) Patent No.: US 6,921,681 B2
(45) Date of Patent: Jul. 26, 2005

(54) PROCESS FOR MANUFACTURING PHOTOSENSITIVE MODULE

(75) Inventors: Cheng-Kuang Sun, Hsinchu (TW); Kuang-Shin Lee, Hsinchu (TW); Jui-Hsiang Pan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/681,458

(22) Filed: Oct. 7, 2003

(65) Prior Publication Data

US 2005/0074916 A1 Apr. 7, 2005

(51) Int. Cl.[7] ............................................... H01L 21/00
(52) U.S. Cl. .............................. 438/69; 438/65; 438/66
(58) Field of Search ............................ 438/65, 66, 68, 438/69

(56) References Cited

U.S. PATENT DOCUMENTS 6,249,034 B1 * 6/2001 Li ................................ 257/432
6,534,340 B1 * 3/2003 Karpman et al. ........... 438/113

* cited by examiner

*Primary Examiner*—Brad Smith
(74) *Attorney, Agent, or Firm*—J.C. Patents

(57) ABSTRACT

A process for fabricating a semiconductor device is provided. The process integrates a cutting film process into the front-end of semiconductor process. The cutting film is directly formed on the curved surface of the micro-lens or a passivation layer is formed on the micro-lens before covering the passivation layer with the cutting film. In addition to micro-particle contamination due to sawing, the process is able to simplify chip packaging and reduce the size of a photosensitive module.

6 Claims, 3 Drawing Sheets

PROCESS FOR MANUFACTURING PHOTOSENSITIVE MODULE

BACKGROUND OF THE INVENTION

1. Field of the Invention

The present invention relates to a semiconductor device. More particularly, the present invention relates to a photosensitive semiconductor device and manufacturing method thereof.

2. Description of the Related Art

Semiconductor fabrication is one of the fastest growing industry in the world. Following the rapid progress of electronic technologies, more personalized and functionally powerful electronic products continue to appear in the market.

In the front-end of semiconductor process, at least five photomasks are required to pattern out the active regions, the gate structures, the metallic layers, the source/drain contacts, the metallic interconnects and the bonding pad openings. To form a photosensitive device, an additional masking step for patterning out an illumination area is required after an ion implantation for forming the source/drain terminals. Light energy received from the photo diode array onto the illumination area is converted into an electrical signal so that some image data can be extracted. The most common photosensitive devices include the charge-couple devices (CCD) and complementary metal-oxide-semiconductor (CMOS) devices.

FIG. 1 is a schematic cross-sectional view showing the structure of a conventional photosensitive device. In the back-end of semiconductor process, modular semiconductor devices 100 (or chip) such as the photosensitive device are singulated and packaged on a substrate such as a lead frame or other types of carrier 110. Thereafter, the package is electrically connected with an external printed circuit board 120 or other external printed circuits such as a flexible printed circuit to form a photosensitive module or an image-sensing module. In addition, the larger the area of the patterned illumination area and the greater the number of photo diode array (not shown) within the illumination area, the higher will be the resolution of the photosensitive module.

It is to be noted that a lens 130 is incorporated into the photosensitive module to increase light intensity after packaging the photosensitive device. Moreover, an infrared cutting film 140 is also set between the lens and the photosensitive module for blocking out most non-visible light. The lens 130 and the infrared cutting film 140 are stationed using a holder 150. Hence, the assembled photosensitive device is quite bulky. Furthermore, during the back-end modularization process, micro-particles produced by cutting or contaminant particles emitted from packaging material may lower the yield of the photosensitive module. In addition, the lens 130 and the infrared cutting film 140 are not packaged together in a single back-end process. Thus, efficiency of the packaging process is also compromised.

SUMMARY OF THE INVENTION

Accordingly, one object of the present invention is to provide a semiconductor manufacturing process for fabricating a photosensitive module that combines the process of fabricating an infrared cutting film with a front-end process. Ultimately, overall quality of a photosensitive module is improved.

A second object of this invention is to provide a photosensitive module that simplifies the packaging process and reduces overall volume of the photosensitive module.

To achieve these and other advantages and in accordance with the purpose of the invention, as embodied and broadly described herein, the invention provides a semiconductor manufacturing process. First, a wafer having at least an active device and an array of photo diode array on an active layer over the wafer is provided. Furthermore, the surface of the wafer furthermore has a metallic interconnect layer for connecting the active devices and the gate terminal of the array of photo diode array. In addition, the surface of the wafer has an illumination area located above the photo diode array. Thereafter, at least a micro-lens is formed over the illumination area of the wafer. Finally, a cutting layer is formed over the micro-lens.

This invention also provides a photosensitive module. The photosensitive module comprises a substrate, an active layer, a metallic interconnect layer, at least a micro-lens and a cutting film. The active layer is set over the substrate. The active layer at least has an active device and a photo diode array. The photo diode array and the active device are electrically connected via the metallic interconnect layer. The micro-lens is set on the surface of the outermost metallic interconnect layer above the photo diode array. The cutting film is set over the micro-lens.

According to one embodiment of this invention, the micro-lens and the cutting film are fabricated together in a single step. Thereafter, a modularization process that includes separating the photosensitive devices and attaching each photosensitive device to a substrate such as a lead frame or other type of carrier to form a photosensitive module or an image-sensing module.

At the end of the chip fabrication process, a low-temperature magnetic sputtering machine can be deployed to deposit a layer of silicon dioxide over the chip. The silicon dioxide layer may serve as a protective layer or plastic material layer. Thereafter, an infrared cutting film is coated over the protective silicon dioxide layer. Finally, the chip-on-film (COF) technique is deployed to package the chip so that some packaging time is saved and micro-particle contamination is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
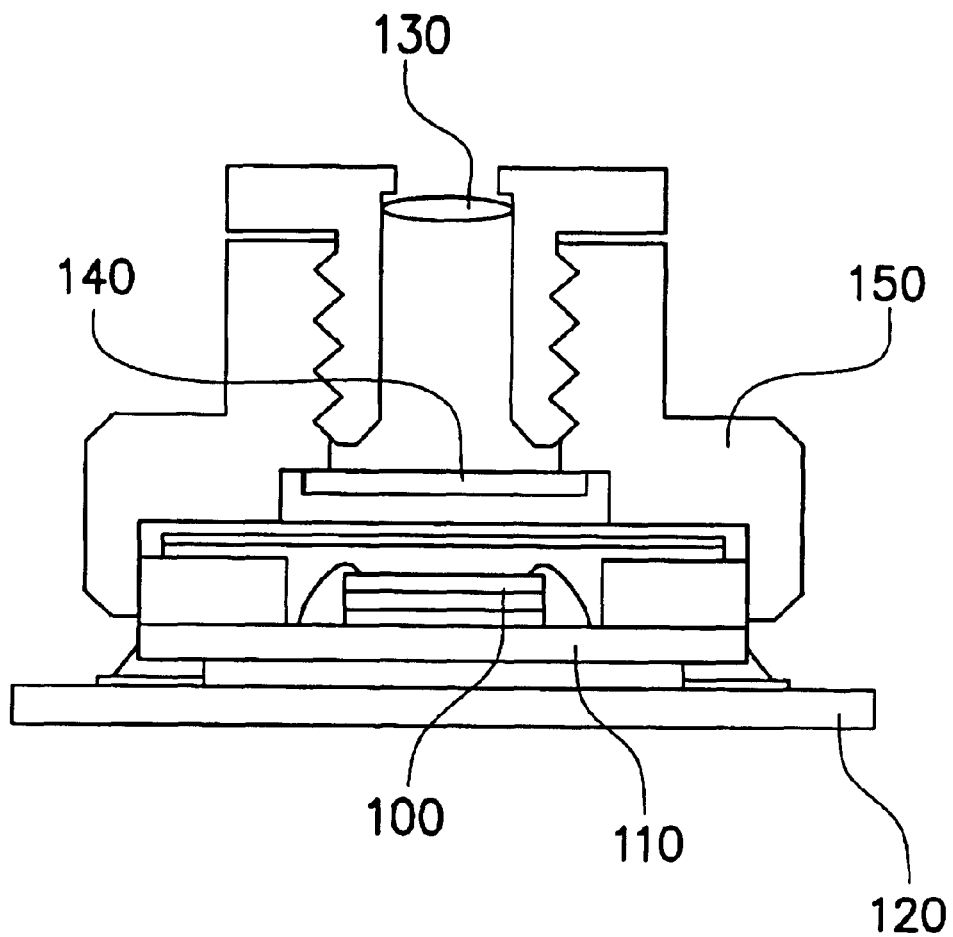
FIG. 1 is a schematic cross-sectional view showing the structure of a conventional photosensitive device.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
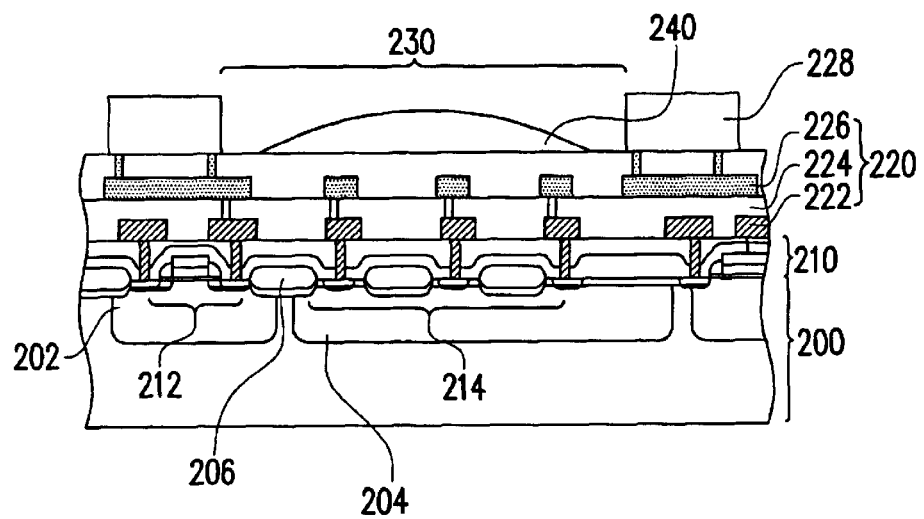
FIGS. 2A through 2D are schematic cross-sectional views showing the progression of steps for producing a semiconductor device according to one preferred embodiment of this invention.

FIGS. 2A through 2D are schematic cross-sectional views showing the progression of steps for producing a semiconductor device according to one preferred embodiment of this invention. As shown in FIG. 2A, a wafer 200 is provided. The wafer 200 has at least an active device 212 and an array of photo diode array 214 formed on an active layer 210 by performing a series of masking steps. The active device 212 is a metal-oxide-semiconductor (MOS) transistor such as a PMOS or CMOS transistor, for example. The PMOS transistor is normally formed on the upper surface of an N-well 202 within the silicon substrate (the wafer) 200. The photo diode array 214 is formed on the upper surface of a P-well 204 within the silicon substrate 200. Thereafter, a gate oxide layer 206 is formed over the silicon substrate 200 to isolate the active device 212 from the photo diode array 214. A second masking step is next carried out to form the contact opening for the gate (the source and the drain) of the active device 212 and the photo diode array 214. Conductive material is deposited into the opening to form electrical connection with the metallic interconnect layer 220 by sputtering aluminum alloy. A dielectric material having good insulating properties such as silicon dioxide is disposed between the first metallic layer 222 and the second metallic layer 226 of the metallic interconnect layer 220 to prevent short-circuit. Another masking step is performed to pattern out the contact openings on the outermost surface of the metallic interconnect layer 220 for forming the bonding pads 228. Up to this point, all the front-end processing steps for fabricating an integrated circuit is almost complete.

Afterwards, another masking step is performed to pattern out an illumination area 230 located above the photo diode array 214. When the photo diode array 214 is illuminated by an external visible light source, the photo diode array 214 is able to detect the light and convert photonic energy into electrical signals. The electrical signals are transmitted to other devices via the active device 212 and the metallic interconnects 220. Thereafter, a micro-lens 240 or a micro-lens array is formed over the illumination area 230 above the photo diode array 214 to focus any incoming light. A high molecular weight polymer material is used to fabricate the micro-lens 240. The curved surface of the micro-lens 240 is self-created due to the high intrinsic surface tension of the material. Hence, the cost for producing the micro-lens 240 is low. Because the aforementioned steps can be carried out in sequence instead of having to perform a modularization operation before carrying out a lens assembly and infrared cutting film fabrication process, both packaging time and cost are reduced.

Figure 2B:
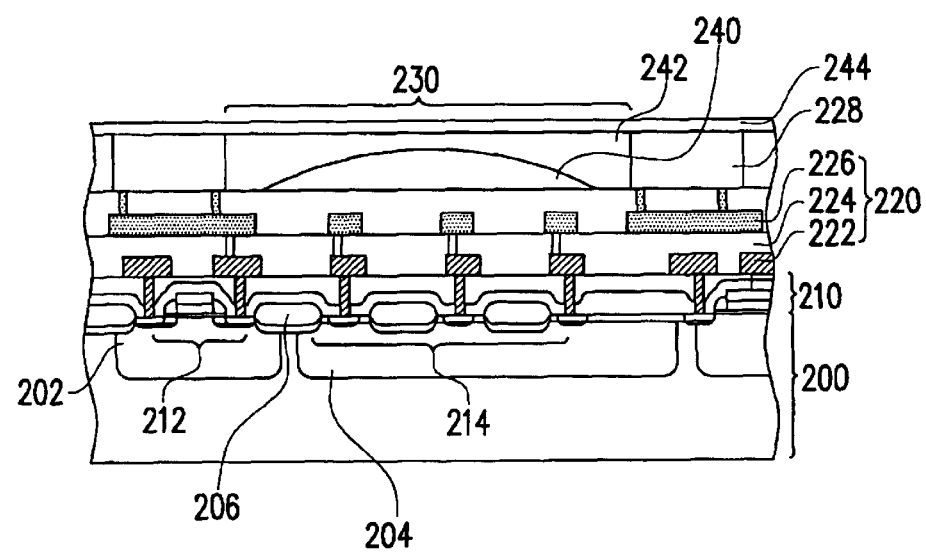

As shown in FIG. 2B, a cutting film 244 is formed over the micro-lens 240. The cutting film 244 is a layer for blocking out infrared or far infrared light but permits the passage of visible light into the photo diode array 214. In this embodiment, a passivation layer 242 is also formed between the cutting film 244 and the micro-lens 240. The passivation layer 242 is comprised of a silicon dioxide layer and may be formed, for example, by performing a low-temperature sputtering process and then planarizing the layer in a chemical-mechanical polishing (CMP) operation. The cutting film 244 is formed over the planarized passivation layer 242, for example, by coating or sputtering. However, a material constituting the cutting film 244 may be directly deposited over the curved surface of the micro-lens 240 by sputtering, for example.

Figure 2C:
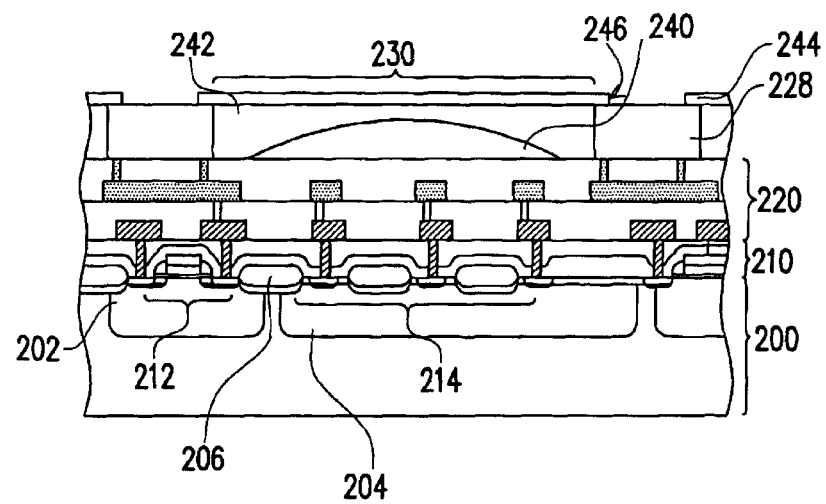
Figure 2D:
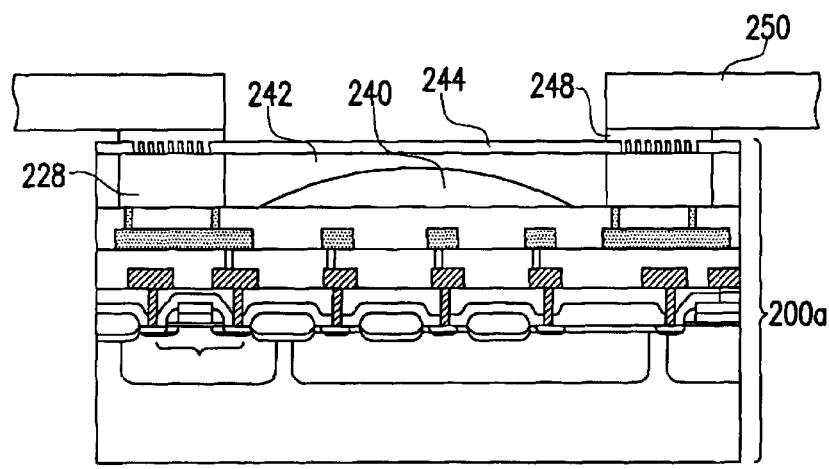

As shown in FIGS. 2C and 2D, the cutting film 244 is patterned using photolithographic and etching processes to form openings 246 that expose the respective bonding pads 228. Since the cutting film 244 and the micro-lens 240 have already been fabricated within the front-end of semiconductor process, the devices can be singulated to form individual chips 200a. Afterwards, the chip 200a is modularized by bonding the chip 200a to a substrate, a lead frame or other type of carrier (not shown). Alternatively, the bonding pads 228 of the chip 200a are electrically connected to a flexible carrier 250 via an anisotropic conductive plastic 248 to form a chip-on-film (COF) light sensor as shown in FIG. 2D.

In summary, major advantages of the semiconductor manufacturing process according to this invention includes:

1. The steps for forming the micro-lens and the cutting film of the photosensitive device are performed before modularizing the chip by performing singulation and packaging processes. Hence, processing time and cost are saved and contamination of the device by micro-particles released from the cutting process is prevented.

2. The fabrication of the cutting film is in the front-end semiconductor process. Moreover, the cutting film may be directly formed over the curved surface of the micro-lens or after forming a passivation layer over the micro-lens. Ultimately, volume occupation of the photosensitive module can be reduced and yield of the photosensitive module can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for manufacturing a semiconductor device, comprising the steps of:

providing a wafer having at least an active device and a photo diode array, wherein the wafer has a metallic interconnect layer that electrically connects with the active device and the photo diode array, the metallic interconnect layer has a plurality of bonding pads located on the surface of the outermost metallic interconnect layer, and the wafer has an illumination area located above the photo diode array;

forming at least a micro-lens over the illumination area of the wafer; and forming a cutting film over the micro-lens, wherein the cutting film is directly formed on the curve surface of the micro-lens.

2. The process of claim 1, wherein alter the step of forming the cutting film, further comprises a step of patterning the cutting film to form a plurality of openings that exposes the respective bonding pads.

3. The process of claim 1, wherein alter the step of forming the cutting film, further comprises a step of singulating the chips within the wafer.

4. A process for manufacturing a semiconductor device, comprising the steps of:

providing a wafer having at least an active device and a photo diode array, wherein the wafer has a metallic interconnect layer that electrically connects with the active device and the photo diode array, the metallic interconnect layer has a plurality of bonding pads located on the surface of the outermost metallic interconnect layer, and the wafer has an illumination area located above the photo diode array, forming at least a micro-lens over the illumination area of the wafer; and forming a cutting film over the micro-lens, wherein before the step of forming the cutting film, further comprises a step of forming a passivation layer over the micro-lens so that the cutting film is formed over the passivation layer instead of directly forming over the micro-lens.

5. The process of claim 4, wherein after the step of forming the cutting film, further comprises a step of patterning the cutting film to form a plurality of openings that exposes the respective bonding pads.

6. The process of claim 4, wherein after the step of forming the cutting film, further comprises a step of singulating the chips within the wafer.

* * * * *